(12) United States Patent
Fahim

(10) Patent No.: US 7,042,972 B2
(45) Date of Patent: May 9, 2006

(54) COMPACT, LOW-POWER LOW-JITTER DIGITAL PHASE-LOCKED LOOP

(75) Inventor: Amr Fahim, Solana Beach, CA (US)

(73) Assignee: Qualcomm Inc, San Diego, CA (US)

( * ) Notice: Subject to any disclaimer, the term of this patent is extended or adjusted under 35 U.S.C. 154(b) by 237 days.

(21) Appl. No.: 10/644,490

(22) Filed: Aug. 19, 2003

(65) Prior Publication Data

US 2004/0202271 A1 Oct. 14, 2004

Related U.S. Application Data

(60) Provisional application No. 60/461,889, filed on Apr. 9, 2003.

(51) Int. Cl.
*H03D 3/24* (2006.01)
(52) U.S. Cl. .................................. 375/376; 327/156
(58) Field of Classification Search ........ 375/373–376; 331/1 R, 11, 25, 34, 1 A; 327/156–159
See application file for complete search history.

(56) References Cited

U.S. PATENT DOCUMENTS

| | | | | |
|---|---|---|---|---|
| 5,548,679 A | * | 8/1996 | Kiyota | 388/811 |
| 5,703,539 A | * | 12/1997 | Gillig et al. | 331/16 |
| 5,872,487 A | * | 2/1999 | Adachi et al. | 331/1 A |
| 6,054,903 A | | 4/2000 | Fiedler | 331/17 |
| 6,236,275 B1 | * | 5/2001 | Dent | 331/1 A |
| 6,606,364 B1 | | 8/2003 | Walley et al. | 375/376 |
| 2001/0033200 A1 | | 10/2001 | Staszewski et al. | 331/18 |

OTHER PUBLICATIONS

Ahn, et al., "A Low-Jitter 1.9-V CMOS PLL for UltraSPARC Microprocessor Applications", IEEE Journal of Solid-State Circuits, vol. 35, No. 3, Mar. 2000 pp. 450-454.

John Maneatis, "Low-Jitter Process-Independent DLL and PLL Based on Self-Biased Techniques", IEEE Journal of Solid-State Circuits, vol. 31, No. 11 Nov. 1996, pp. 1723-1732.

Wu, et al., "A Low Glitch 10-bit 75 MHz CMOS Video D/A Converter", IEEE Journal of Solid-State Circuits, vol. 30, No. 1, Jan. 1995, pp. 68-72.

Chung, et al., "An All-Digital Phase-Locked Loop for High-Speed Clock Generation", IEEE Journal of Solid-State Circuits, vol. 38, No. 2, Feb. 2003, pp. 347-351.

Hwang, et al., "A Digitally Controlled Phase-Locked Loop with a Digital Phase-Frequency Detector for Fast Acquisition," IEEE Journal of Solid-State Circuits, vol. 36, No. 10, Oct. 2001, pp. 1574-1581.

* cited by examiner

*Primary Examiner*—Don N. Vo
(74) *Attorney, Agent, or Firm*—Philip R. Wadsworth; Charles D Brown; George C Pappas

(57) ABSTRACT

A digital PLL includes an adaptive PFD, an adaptive loop filter, an iDAC, an ICO, and a divider. The adaptive PFD receives a reference signal and a feedback signal, determines phase error between the two signals, and provides a PFD value for each phase comparison period. The magnitude of the PFD value is adjusted to achieve fast frequency acquisition and reduced jitter. The adaptive loop filter updates its output whenever a PFD value is received, widens the PLL loop bandwidth if a large phase error is detected, and narrows the loop bandwidth if a small average phase error is detected. The iDAC, which can be implemented with both steered and single-ended current sources, converts the loop filter output into analog current. The ICO provides an oscillator signal having a phase determined by the iDAC output. The divider divides the oscillator signal by a factor of N and provides the feedback signal.

35 Claims, 10 Drawing Sheets

COMPACT, LOW-POWER LOW-JITTER DIGITAL PHASE-LOCKED LOOP

This application claims the benefit of provisional U.S. Application Ser. No. 60/461,889 entitled "Compact, Low-Power Low-Jitter Digital PLL," filed Apr. 9, 2003.

BACKGROUND

1. Field

The present invention relates generally to electronics circuits, and more specifically to a digital phase-locked loop (PLL).

2. Background

Phase-locked loops are an integral part of many electronics circuits and are particularly important in communication circuits. For example, digital systems use clock signals to trigger synchronous circuits (e.g., flip-flops). Transmitter and receiver systems use local oscillator (LO) signals for frequency upconversion and downconversion, respectively. Wireless devices (e.g., cellular phones) in wireless communication systems typically use clock signals for digital circuitry and LO signals for transmitter and receiver circuitry. Clock and LO signals are often generated with phase-locked loops.

FIG. 1 shows a classical PLL 100, which consists of a phase frequency detector (PFD) 110, a loop filter 120, a voltage controlled oscillator (VCO) 140, and a divider 150. VCO 140 generates an oscillator signal having a frequency determined by a control signal from loop filter 120. Divider 150 divides the oscillator signal in frequency by a factor of N, where $N \geq 1$, and provides a feedback signal. Phase frequency detector 110 receives a reference signal and the feedback signal, compares the phases of the two signals, and provides a detector signal that is proportional to the detected phase difference or error between the two signals. Loop filter 120 filters the detector signal and provides the control signal for VCO 140. Loop filter 120 adjusts the control signal such that the phase of the feedback signal is locked to that of the reference signal.

For an analog PLL, the loop filter is implemented with analog circuit components (e.g., capacitors and resistors). An analog PLL design is prone to various disadvantages such as a large die area for the loop filter (which can occupy as much as 50% of the total area of the PLL), significant noise coupling through the substrate for a system-on-a-chip (SOC) design, and large spurs in the oscillator signal due to gate leakage. Gate leakage increases exponentially with the reduction in oxide thickness and is thus more problematic as integrated circuit (IC) technology scales smaller.

A digital PLL avoids the disadvantages described above for the analog PLL. However, a major challenge for a digital PLL design is obtaining a wide closed loop bandwidth while maintaining high frequency resolution. Wide loop bandwidth is desired for better tracking of the reference signal, which then reduces the amount of phase noise generated by the VCO and results in lower jitter. Jitter is the deviation from the average or expected cycle of the reference signal. High frequency resolution is desired to reduce jitter. The limitation in frequency resolution results from coarse quantization of the phase error with a high frequency signal, such as the oscillator signal. In one conventional method, improved frequency resolution is achieved by taking more phase measurements before updating the loop filter. However, this method severely limits the achievable closed loop bandwidth (which then impacts jitter) and further introduces a large loop delay that degrades stability.

There is therefore a need in the art for a digital PLL with improved performance.

SUMMARY

A compact, low-power, low-jitter digital PLL having improved performance over the classical analog PLL and other conventional digital PLLs is provided herein. The innovative digital PLL implements several techniques to achieve high frequency accuracy and wide loop bandwidth.

In one specific embodiment, the innovative digital PLL includes an adaptive PFD, an adaptive loop filter (LF), a current digital-to-analog converter (iDAC), a current controlled oscillator (ICO), and a divider. The adaptive PFD receives a reference signal and a feedback signal, compares the phases of these two signals to determine the phase error between the signals, and provides a PFD value for each phase comparison period (defined below). The magnitude of the PFD value is dependent on a detector gain, which can be adjusted to achieve both fast frequency acquisition when the digital PLL is not locked and reduced jitter when the digital PLL is locked.

The adaptive loop filter is updated whenever a PFD value is received from the adaptive PFD. The adaptive loop filter uses an asynchronous timing mechanism and carry look-ahead adders (CLAs) to minimize delay, which allows for a wide loop bandwidth and improves loop stability. The adaptive loop filter also analyzes the phase errors from the PFD and adjusts the closed loop response of the digital PLL based on the phase error analysis. For example, the adaptive loop filter can widen the loop bandwidth whenever a large phase error is detected so that the digital PLL can more quickly track out the large phase error. Conversely, the adaptive loop filter can narrow the loop bandwidth when a small average phase error is detected to minimize supply noise induced jitter.

The iDAC receives and converts the output of the adaptive loop filter into analog current. The iDAC can be designed to minimize both power consumption and switching noise. This is achieved by implementing the L least significant bits (LSBs) of the iDAC with steered current sources and the M most significant bits (MSBs) with single-ended current sources. Improved iDAC linearity can also be achieved by implementing the M MSBs with thermal decoding instead of binary decoding, as described below. The ICO receives the output from the iDAC and provides an oscillator signal having a phase determined by the iDAC output. The divider divides the oscillator signal in frequency by a factor of N and provides the feedback signal.

In general, a digital PLL may be designed to implement one, multiple, or all of the techniques described herein to achieve good performance. The digital PLL may be implemented in one or more integrated circuits and may be advantageously used for a system-on-a-chip design. The digital PLL may also be implemented in a wireless device (e.g., a cellular phone) and other electronic devices. Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
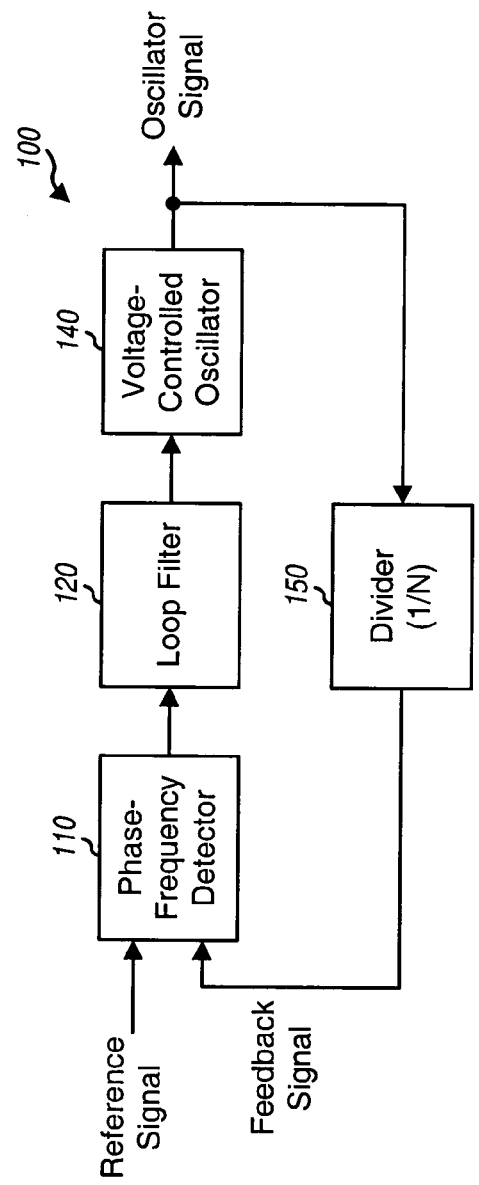
FIG. 1 shows a classical PLL.
Figure 2:
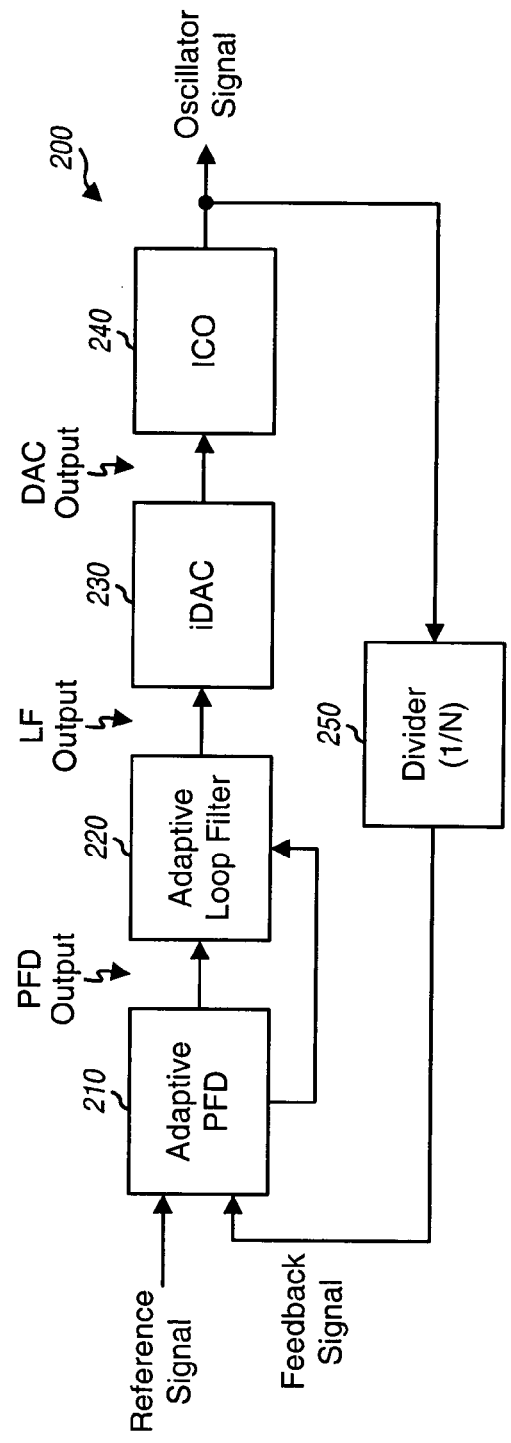
FIG. 2 shows a compact, low-power, low-jitter digital PLL.

FIG. 2 shows a block diagram of a compact, low-power, low-jitter digital PLL 200. Digital PLL 200 includes an adaptive PFD 210, an adaptive loop filter 220, an iDAC 230, an ICO 240, and a divider 250.

Adaptive PFD 210 receives a reference signal and a feedback signal, compares the phases of the reference and feedback signals, and provides a PFD output. The PFD output comprises a sequence of PFD values, with each PFD value being dependent on the detected phase difference or error between the reference and feedback signals and a detector gain. Adaptive PFD 210 also provides a detector output, which comprises a sequence of phase error values. Each phase error value indicates whether the reference signal is early or late with respect to the phase of the feedback signal. Adaptive PFD 210 provides fast frequency tuning, less jitter, and other advantages, as described below.

Adaptive loop filter 220 receives the PFD output from adaptive PFD 210, filters the PFD output with an adaptive loop filter response, and provides a loop filter (LF) output. Adaptive loop filter 220 also receives the detector output and detects for (1) a large phase error between the reference and feedback signals and (2) a small average phase error between the two signals. Adaptive loop filter 220 adjusts the closed loop response of the digital PLL (e.g., the loop bandwidth and/or damping) based on various factors such as the results of the phase error analysis, the operating state of digital PLL 200, and so on, as described below. Adaptive loop filter 220 also imposes a small delay so that a wider loop bandwidth and improved loop stability can be attained.

iDAC 230 receives the LF output, converts the multi-bit digital LF output into analog current, and provides an iDAC output. iDAC 230 is designed to minimize both power consumption and switching noise, as described below. ICO 240 receives the iDAC output from iDAC 230 and provides an oscillator signal having a phase determined by the iDAC output. ICO 240 is designed to have good immunity to noise from the power supply and a good linearity range for the current-to-frequency transfer function. Divider 250 receives the oscillator signal from ICO 240, divides the frequency of the oscillator signal by a factor of N, and provides the feedback signal. N may be any value one or greater (N>1) and can be an integer or non-integer.

FIG. 2 shows an exemplary digital PLL. Other digital PLLs may also be implemented with fewer, additional, and/or different units than those shown in FIG. 2. For example, iDAC 230 and ICO 240 may be replaced with a VCO. Also, a conventional PFD may be used for adaptive PFD 210, a conventional loop filter may be used for adaptive loop filter 220, and so on. Exemplary designs for adaptive PFD 210, adaptive loop filter 220, iDAC 230, and ICO 240 are described below.

Figure 3:
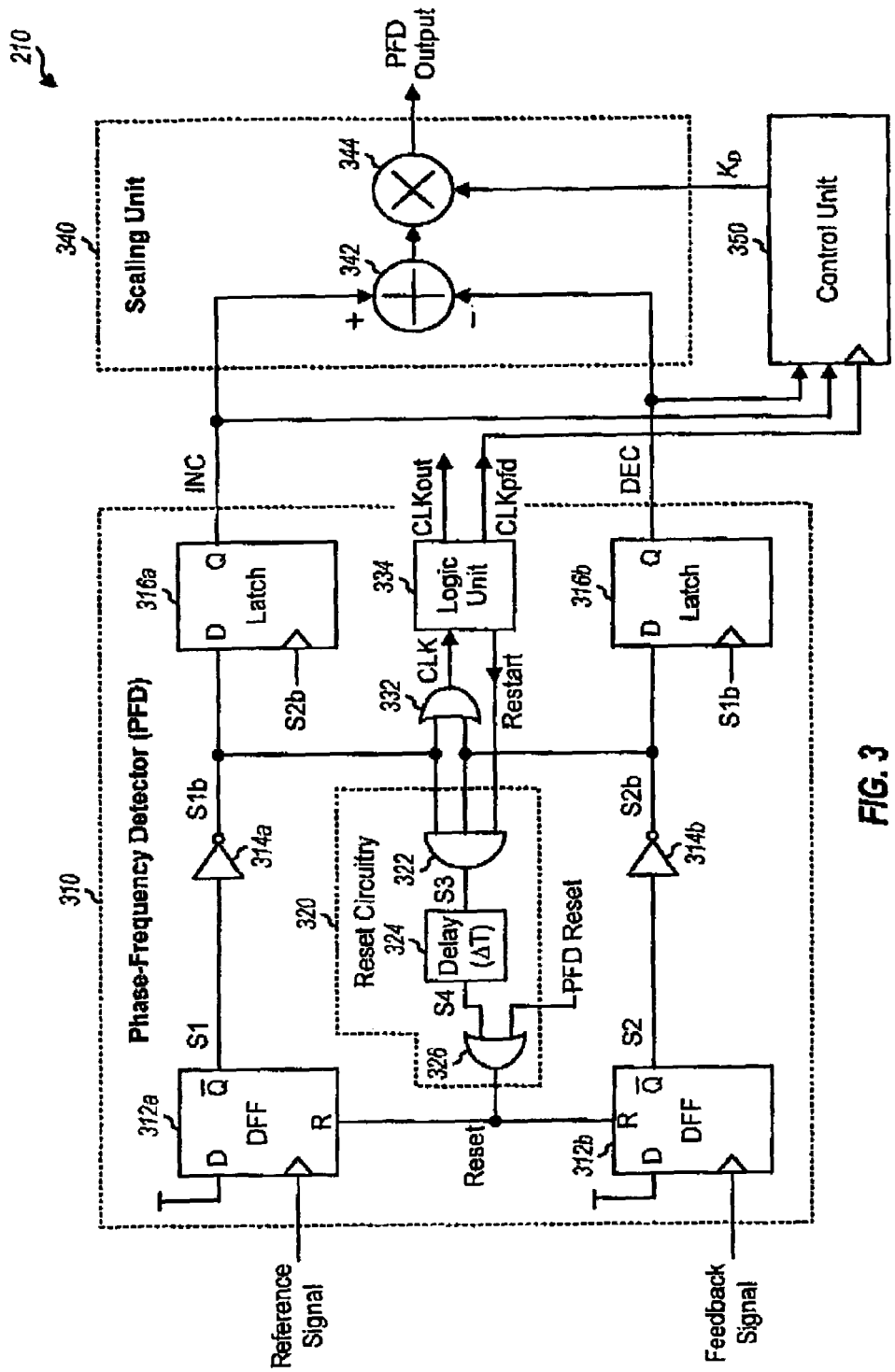
FIG. 3 shows an adaptive PFD within the digital PLL.

FIG. 3 shows an embodiment of adaptive PFD 210, which includes a PFD 310, a sealing unit 340, and a control circuit 350. Within PFD 310, the reference signal and the feedback signal are provided to the clock inputs of D flip-flops (DFFs) 312a and 312b, respectively. The data (D) inputs of DFFs 312a and 312b couple to the power supply and receive logic high. The $\overline{Q}$ outputs of DEFs 312a and 312b provide the S1 and S2 signals, respectively. An inverter 314a receives and inverts the S1 signal and provides an S1b signal to the data input of a latch 316a and the clock input of a latch 316b. An inverter 314b receives and inverts the S2 signal and provides an S2b signal to the data input of latch 316b and the clock input of latch 316a. Latches 316a and 316b are thus cross-coupled by the S1b and S2b signals. The Q output of latch 316a provides an INC signal, and the Q output of latch 316b provides a DEC signal.

Reset circuitry 320 resets DFFs 312a and 312b and enables latches 316a and 316b. Within reset circuitry 320, an AND gate 322 receives the S1b and S2b signals and a Restart signal from a logic unit 334, performs a logical AND on the three inputs, and provides an S3 signal. A delay unit 324 receives and delays the S3 signal by $\Delta T$ and provides an S4 signal. An OR gate 326 receives the S4 signal and a PFD Reset signal, performs a logical OR on the two inputs, and provides a Reset signal to the reset (R) inputs of DFFs 312a and 312b. An OR gate 332 receives the S1b and S2b signals, performs a logical OR on the two inputs, and provides a CLK signal. Logic unit 334 receives the CLK signal and provides the Restart signal and clock signals (e.g., CLKout) for other units of digital PLL 200. Each clock signal is a different delayed version of the CLK signal, with the triggering edges for each clock signal being delayed by a particular amount of time relative to the start of the PFD values on the PFD output. The other units use these clock signals to latch the PFD values from adaptive PFD 210.

Figure 4:
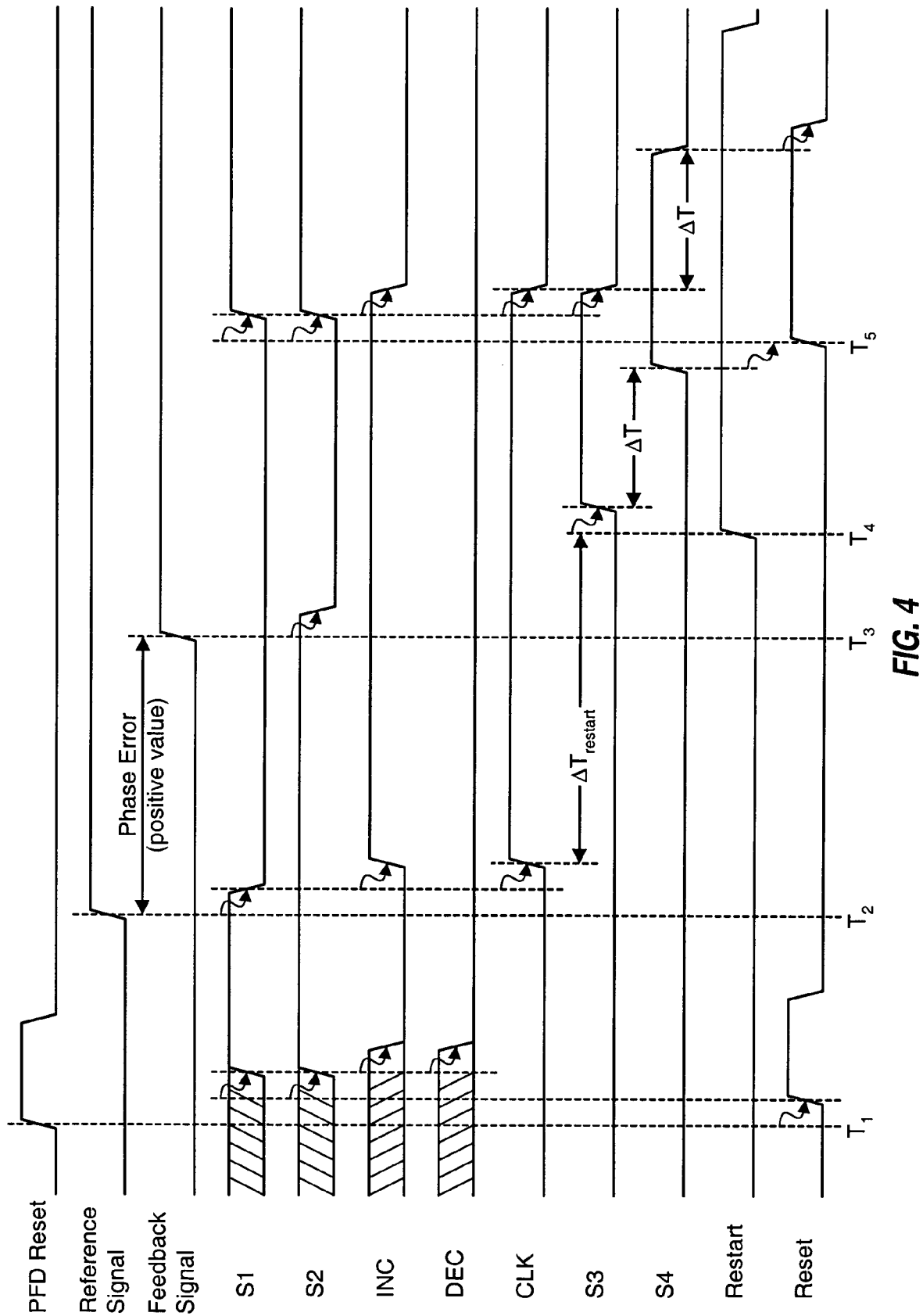
FIG. 4 shows a timing diagram that illustrates the operation of a PFD within the adaptive PFD.

FIG. 4 shows a timing diagram that illustrates the operation of PFD 310. When digital PLL 200 is first activated, the $\overline{Q}$ outputs of DFFs 312a and 312b (and thus the S1 and S2 signals) are both set to logic highs by applying a logic high pulse on the PFD Reset signal at time $T_1$. Latches 316a and 316b are enabled by the logic highs on the S1 and S2 signals, latch the logic lows on the S1b and S2b signals, and provide logic lows on the INC and DEC signals.

In the example shown in FIG. 4, a leading edge appears on the reference signal at time $T_2$, before a leading edge on the feedback signal. The leading edge on the reference signal causes the $\overline{Q}$ output of DFF 312a and the S1 signal to transition to logic low, which then causes latch 316a to latch a logic high on the S1b signal and provides a logic high on the INC signal. The logic low on the S1 signal also disables latch 316b, and the logic high on the S1b signal causes the CLK signal to transition to logic high.

A leading edge appears on the feedback signal at time $T_3$. This leading edge causes the S2 signal to transition to logic low and the S2b signal to transition to logic high. Since latch 316b is disabled by the logic low on the S1 signal, the DEC signal does not change state when the S2b signal transitions to logic high.

The Restart signal is a delayed version of the CLK signal. After a delay of $\Delta T_{restart}$ from the leading edge of the CLK signal, the Restart signal transitions to logic high at time $T_4$. The logic highs of the S1b, S2b, and Restart signal cause the S3 signal from AND gate 322 to transition to logic high. The S4 signal is a delayed version of the S3 signal and transitions to logic high after a delay of $\Delta T$. The Reset signal then transitions to logic high at time $T_5$ and resets DFFs 312a and 312b, which then causes the S1 and S2 signals to transition to logic high and the S1b and S2b signals to transition to logic low. The logic lows on the S1b and S2b signals cause the CLK and S3 signals to transition to logic low. The logic low on the S3 signal causes the S4 and Reset signals to transition to logic low $\Delta T$ later.

The logic highs on the S1 and S2 signals shortly after time $T_5$ cause latches 316a and 316b to reset the INC and DEC signals. PFD 310 is now ready to receive another leading edge on either the reference signal or the feedback signal. The complementary actions occur if a leading edge appears on the feedback signal before a leading edge on the reference signal.

The INC and DEC signals are indicative of the phase error between the reference and feedback signals. As shown in FIG. 4, the INC signal is set to logic high if a leading edge appears on the reference signal first (i.e., the phase of the reference is early with respect to the phase of the feedback signal). Although not shown in FIG. 4, the DEC signal is set to logic high if a leading edge appears on the feedback signal first (i.e., the phase of the reference is late). The INC and DEC signals are thus indicative of the sign or polarity of the phase error (and not the magnitude of the phase error). The logic values on the INC and DEC signals may be latched with a delayed version of the CLK signal.

Referring back to FIG. 3, PFD 310 is reset by a logic high on the S3 signal, which requires the S1b, S2b, and Restart signals to be at logic high. The S1b and S2b signals are brought to logic high by leading edges on the reference and feedback signals, respectively. The Restart signal is a delayed version of the CLK signal, which is brought to logic high by the first leading edge on either the reference or feedback signal. The delay $\Delta T_{restart}$ is a fixed value and selected such that adaptive loop filter 220 and iDAC 230 are given sufficient amounts of time to process each PFD value. In FIG. 4, if the Restart signal transitions to logic high before the leading edge on the feedback signal, then reset circuitry 320 waits for the leading edge on the feedback signal before resetting PFD 310. A new phase comparison period starts whenever PFD 310 is reset. Each phase comparison period generally corresponds to one period of the slower of the reference and feedback signals. Each phase comparison period includes one leading edge on the slower signal and at least one leading edge on the faster signal. For example, if the feedback signal is much slower than the reference signal, then one phase comparison period may span multiple periods of the reference signal. The output rate of PFD 210 may thus be slower than the frequency of the reference signal (e.g., one PFD value may be provided for multiple periods of the reference signal if the feedback signal is much slower than the reference signal).

Latches 316a and 316b effectively detect the polarity or sign of the phase error between the reference and feedback signals and provides a logic value indicative of the detected phase error polarity. When digital PLL 200 is locked, the leading edges on the reference and feedback signals are approximately time-aligned, and the S1 and S2 signals toggle near the same time. The outputs of latches 316a and 316b may be re-latched with another set of latches (not shown in FIG. 3) to avoid meta-stability caused by the S1 and S2 signals toggling simultaneously.

The INC and DEC signals form a detector signal, which contains one phase error value for each phase comparison period. Each phase error value can be an INC value, a DEC value, or a null value. The phase error value is an INC value if the phase of the reference signal is early with respect to the phase of the feedback signal, which is indicated by a logic high on the INC signal and a logic low on the DEC value, as shown in FIG. 4. The phase error value is a DEC value if the phase of the reference signal is late with respect to the phase of the feedback signal, which is indicated by a logic high on the DEC signal and a logic low on the INC signal. The phase error value is a null value if the phase of the reference signal is closely aligned with the phase of the feedback signal and PFD 310 is not able to discern which signal is early. The null value is indicated by both INC and DEC signals having the same logic value. The range of phase difference or error in which the PFD is not able to resolve the phase error is often referred to as a "dead zone" of the PFD.

Scaling unit 340 receives the INC and DEC signals from PFD 310 and a detector gain $K_D$ from control unit 350 and derives the PFD output based on these inputs. Within scaling unit 340, a summer 342 subtracts the DEC signal from the INC signal and provides the difference between these two signals. A multiplier 344 receives and scales the output of summer 342 with the detector gain $K_D$ and provides the PFD output.

Adaptive PFD 210 provides a multi-bit PFD value on the PFD output for each phase comparison period. The sign of the PFD value (i.e., + or −) is dependent on the sign of the phase error between the reference and feedback signals. The PFD value is a positive value for a positive phase error, which is the case if the phase of the reference signal is early with respect to the phase of the feedback signal, as shown in FIG. 4. The PFD value is a negative value for a negative phase error. Whether the phase error is positive or negative can be determined by the logic values of the INC and DEC signals. The magnitude of the PFD value is determined by the detector gain $K_D$. The PFD value, $PFD_{out}$, may be expressed as:

$$PFD_{out} = \begin{cases} K_D & \text{if } INC = \text{logic high AND } DEC = \text{logic low,} \\ -K_D & \text{if } DEC = \text{logic high AND } INC = \text{logic low.} \end{cases} \quad \text{Eq (1)}$$

Control circuit 350 provides the detector gain $K_D$ for scaling unit 340. During an acquisition phase, which may be entered when digital PLL 200 is first activated or whenever directed, the phase error between the reference and feedback signals may be large. A large detector gain may then be used to speed up acquisition. Once the digital PLL is locked to the reference signal, the phase error is typically small and continually toggles between the + and − polarity. A small detector gain may then be used for the PFD output to reduce jitter.

In an embodiment, control circuit 350 performs binary tuning of frequency in order to achieve fast frequency acquisition. Binary frequency tuning may be enabled when the digital PLL is operating in the acquisition mode or triggered by some other event. With binary frequency tuning, the detector gain $K_D$ is initially set to a maximum value of $K_{Dmax}$ to provide large PFD values for the PFD output. This allows the digital PLL to more quickly adjust the ICO to track out the phase error. Whenever a change in phase error polarity is detected, the detector gain $K_D$ is reduced. A change in phase error polarity occurs if (1) the phase of the reference signal changes from being early to being late with respect to the phase of the feedback signal or (2) the phase of the reference signal changes from being late to being early. A change in phase error polarity can be detected based on the logic values on the INC and DEC signals. In any case, the smaller detector gain $K_D$ reduces the magnitude of the PFD values correspondingly, and the digital PLL adjusts the ICO more slowly. The process continues until the detector gain $K_D$ reaches a minimum value of $K_{Dmin}$. At this point, the detector gain $K_D$ is maintained at $K_{Dmin}$ until another event triggers an adjustment of the detector gain. Once the digital PLL is locked, the phase error from PFD 310 is assumed to be small, and a small value can then be used for the detector gain.

Figure 5:
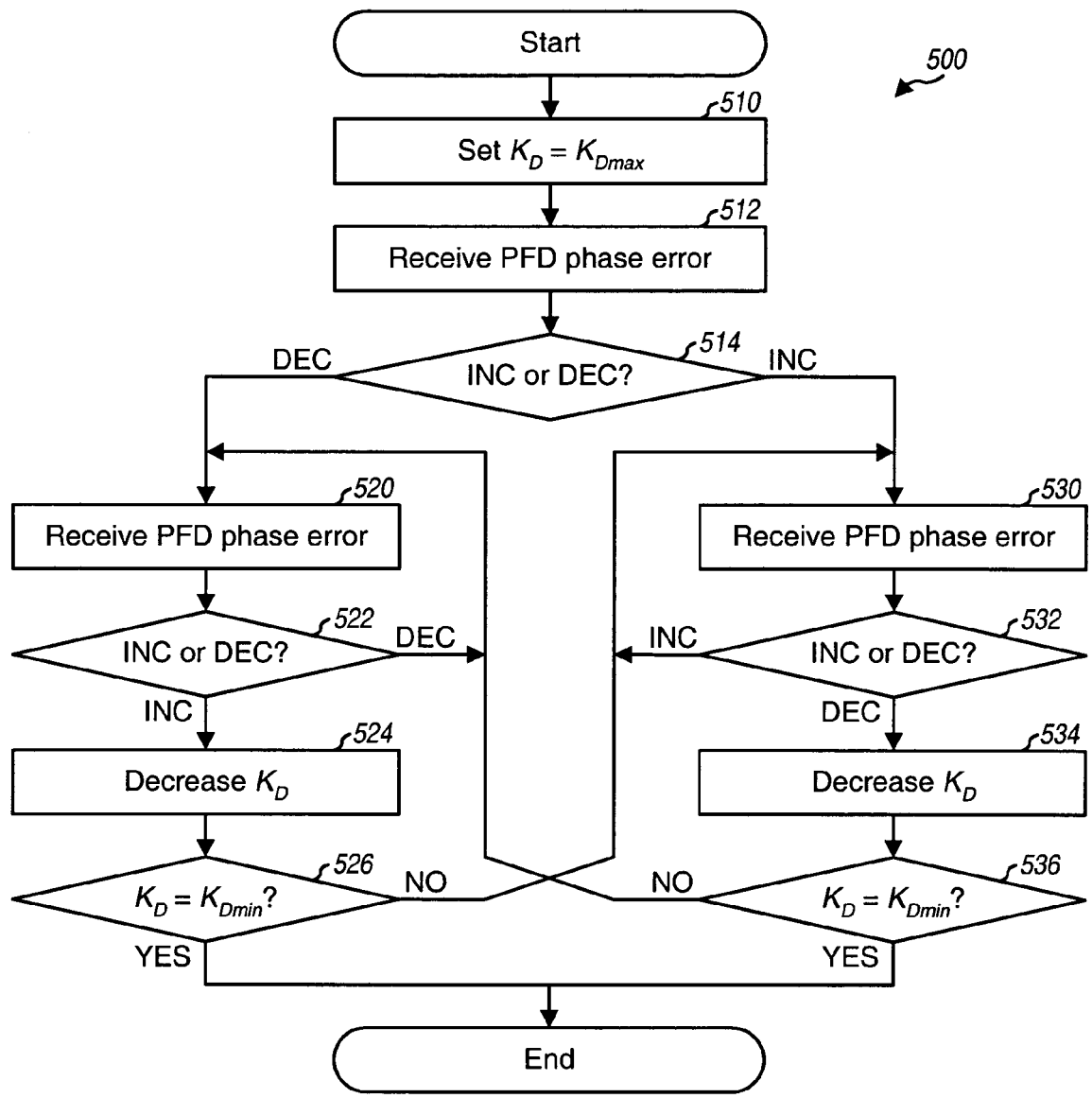
FIG. 5 shows a flow diagram of a process for binary tuning of frequency.

FIG. 5 shows a flow diagram of a process 500 performed by control unit 350 for binary tuning of frequency. Initially, the detector gain $K_D$ is set to the maximum value of $K_{Dmax}$ (step 510). A phase error is received from PFD 310 (step 512), and the value of the phase error is determined (step 514). The process proceeds to step 520 if the phase error is a DEC value and to step 530 if the phase error is an INC value.

Step 520 can be reached from step 514 or 536 and corresponds to the state in which the last phase error is a DEC value. In step 520, the next phase error is received from PFD 310. The value of this phase error is then determined (step 522). If the phase error is a DEC value, indicating no change in the phase error polarity, then the process returns to step 520. Otherwise, if the phase error is an INC value, indicating a change in the phase error polarity and possibly an over adjustment of the phase of the feedback signal, then the detector gain $K_D$ is decreased (step 524). A determination is then made whether or not the detector gain $K_D$ is equal to the minimum value of $K_{Dmin}$ (step 526). If the answer is 'yes', then the binary frequency tuning is completed and the process terminates. Otherwise, the process proceeds to step 530.

Step 530 can be reached from step 514 or 526 and corresponds to the state in which the last phase error is an INC value. In step 530, the next phase error is received from PFD 310. The value of this phase error is then determined (step 532). If the phase error is an INC value, indicating no change in the phase error polarity, then the process returns to step 530. Otherwise, if the phase error is a DEC value, indicating a change in the phase error polarity and possibly an over adjustment of the feedback signal phase, then the detector gain $K_D$ is decreased (step 534). A determination is then made whether or not the detector gain $K_D$ is equal to the minimum value of $K_{Dmin}$ (step 536). The process terminates if the answer is 'yes' and proceeds to step 520 otherwise.

To simplify the implementation of binary tuning algorithm, the detector gain $K_D$ may be selected to be powers of two. The detector gain $K_D$ may be reduced by a factor of two whenever a change in the phase error polarity is detected. However, the detector gain $K_D$ may also be reduced by some other amounts. If the PFD value is a B-bit value, then the maximum value $K_{Dmax}$ may be set equal to the one-half of the most significant bit (to account for positive and negative PFD values), and the minimum value $K_{Dmin}$ may be set equal to the least significant bit. Other maximum and minimum values may also be used for the detector gain $K_D$.

Adaptive PFD 210 provides PFD values at a rate that is determined by the frequencies of the reference and feedback signals, as described above. If the frequency of the feedback signal is very slow, which may be the case when the digital PLL is first powered on, then adaptive PFD 210 provides PFD values at a rate slower than the frequency of the reference signal. This can provide higher frequency resolution for the digital PLL. However, fast acquisition is still possible through the use of a larger detector gain $K_D$. When the digital PLL is locked, adaptive PFD 210 provides PFD values at a rate close to the frequency of the reference signal. In the locked state, the phase error should ideally toggle in polarity for each period of the reference signal, but normally toggles at a slower rate due to noise and other artifacts. However, jitter is reduced through the use of a small detector gain $K_D$.

Figure 6:
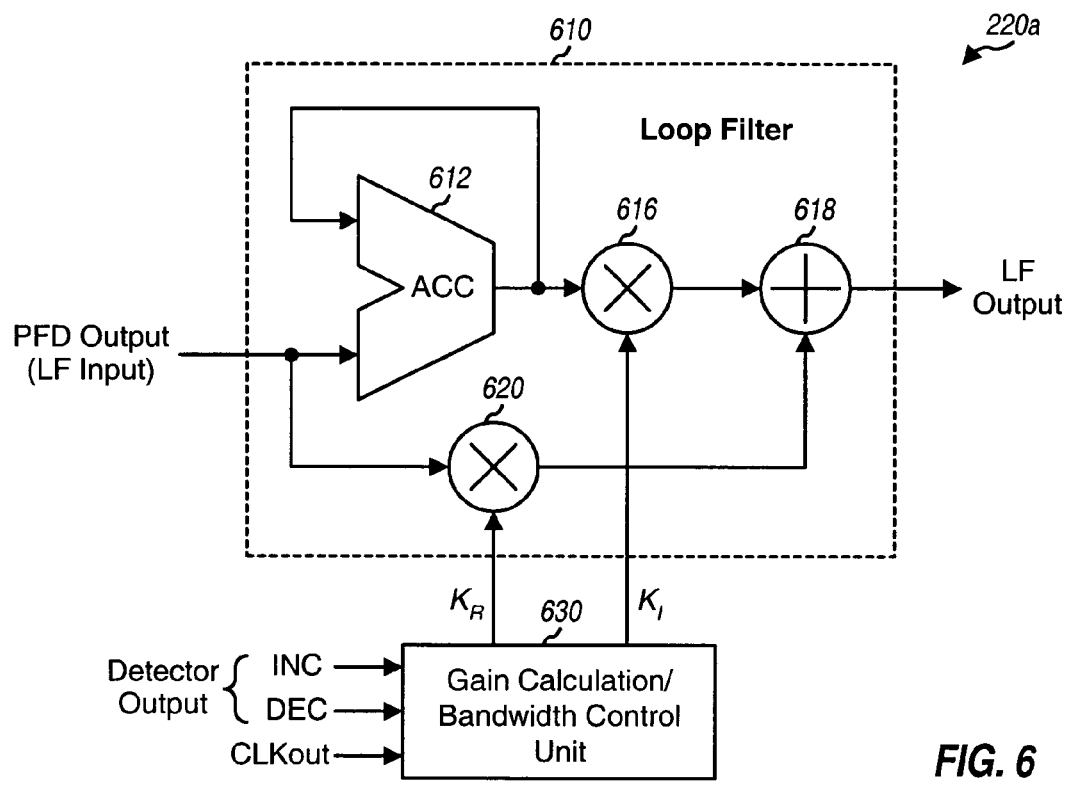
FIG. 6 shows an adaptive loop filter within the digital PLL.

FIG. 6 shows an embodiment of adaptive loop filter 220a, which is one embodiment of loop filter 220 in FIG. 2. Adaptive loop filter 220a includes a loop filter 610 and a gain calculation/bandwidth control unit 630. Loop filter 610 updates the LF output whenever a PFD value is received on the PFD output.

Within loop filter 610, the PFD output from adaptive PFD 210 (which is also the LF input) is provided to an accumulator (ACC) 612 and a multiplier 620. Accumulator 612 sums a PFD value in the PFD output with a current accumulated value from accumulator 612 and provides an updated accumulated value, which is stored by accumulator 612. A multiplier 616 receives and scales the current accumulated value with a loop filter gain $K_I$ and provides a scaled accumulated value to a summer 618. Similarly, multiplier 620 scales the PFD value with a loop filter gain $K_R$ and provides a scaled PFD value to summer 618. $K_I$ and $K_R$ are referred to as the accumulator path gain and the forward or direct path gain, respectively. Summer 618 combines the scaled accumulated value with the scaled PFD value and provides the LF output.

As indicated in FIG. 2, the closed loop response of digital PLL 200 is influenced by delays introduced by the various units that make up the digital PLL. In particular, the loop bandwidth of the digital PLL is limited by the total delays for all of the units within the closed loop of the digital PLL. For a given loop bandwidth, more delay can also increase the likelihood of loop instability. Thus, to attain a wide loop bandwidth and improved loop stability, it is desirable to minimize the delay of each unit within the digital PLL.

Several techniques may be used to simplify the design of loop filter 220 and to reduce the delay of the loop filter. First, the loop filter gains $K_I$ and $K_R$ may be selected to be powers of two so that multipliers 616 and 620 can be implemented with multiplexers. Second, an asynchronous timing mechanism is used to latch the PFD values from adaptive PFD 210. For the asynchronous timing mechanism, each PFD value is latched with a corresponding pulse on the CLKout signal provided by adaptive PFD 210. This pulse is sufficiently delayed relative to the start of the PFD value to ensure proper logic operation, but is typically much earlier than the start of the next phase comparison period. For a conventional synchronous digital PLL, the loop filter typically updates with the clock pulse for the next phase comparison period. Third, accumulator 612 and adder 618 may be implemented with carry look-ahead adders (CLAs). Wider closed loop bandwidth and improved loop stability may be achieved with the smaller delay resulting from the use of the asynchronous timing mechanism and CLAs.

Figure 7:
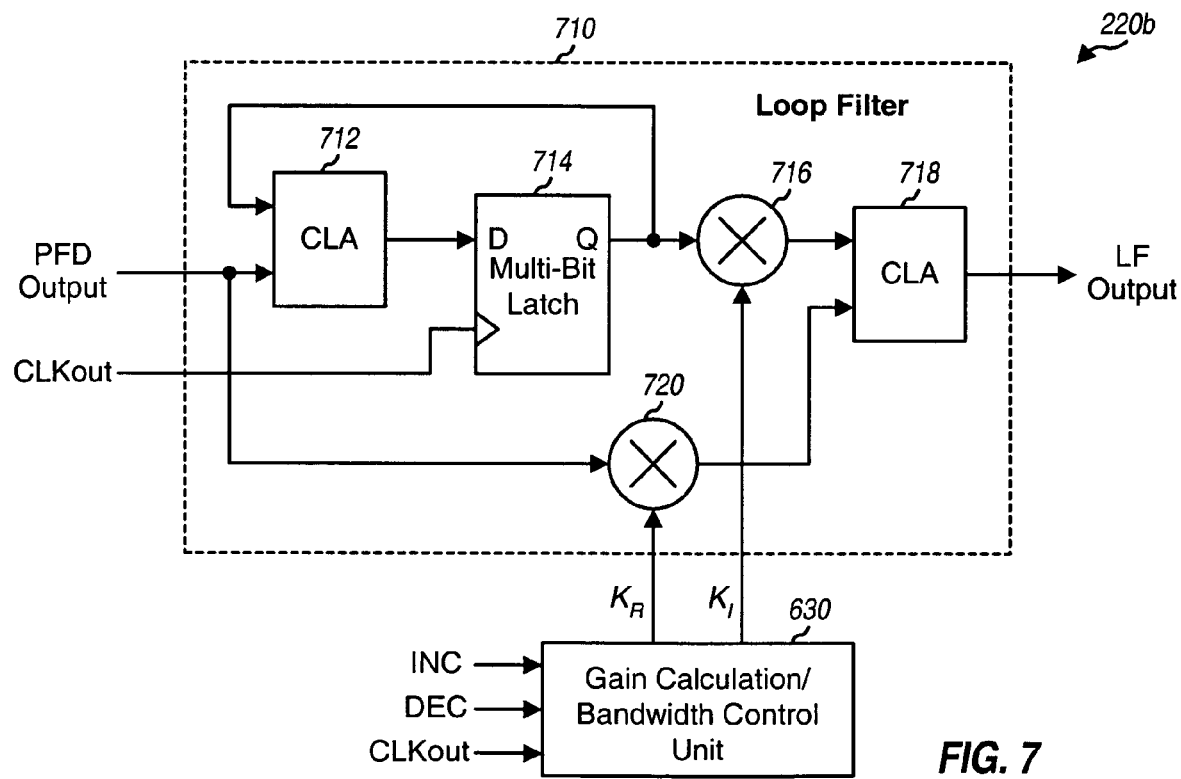
FIG. 7 shows an implementation of the adaptive loop filter with CLAs.

FIG. 7 shows an embodiment of an adaptive loop filter 220b that uses the asynchronous timing mechanism and is implemented with CLAs. Adaptive loop filter 220b is another embodiment of loop filter 220 and includes a loop filter 710 and gain calculation/bandwidth control unit 630.

Within loop filter 710, the PFD output from adaptive PFD 210 is provided to a CLA 712 and a multiplier 720. CLA 712 sums a PFD value in the PFD output with the output from a multi-bit latch 714 and provides the result back to latch 714. (A register may also be used for latch 714.) Latch 714 is enabled by the CLKout signal from adaptive PFD 210, which is simply a delayed version of the CLK signal shown in FIG. 4. Loop filter 710 is thus updated shortly after a new PFD value is received from adaptive PFD 210. A multiplier 716 receives and scales the output value from latch 714 with the loop filter gain $K_I$ and provides a scaled accumulated value to a CLA 718. Similarly, multiplier 720 scales the PFD value with the loop filter gain $K_R$ and provides a scaled PFD value to CLA 718. CLA 718 combines the scaled accumulated value with the scaled PFD value and provides the LF output. CLAs 712 and 718 can be implemented in a manner known in the art. An exemplary implementation of the carry-lookahead adder is described by Bellaouar et al., in "Low-Power Digital VLSI Design," Kluwer Academic Publishers, 1995.

In FIGS. 6 and 7, gain calculation/bandwidth control unit 630 provides the loop filter gains $K_I$ and $K_R$ for the accumulator and forward paths, respectively. These two gains determine the characteristics of the digital PLL closed loop response—namely the loop bandwidth and the damping factor. The gains $K_I$ and $K_R$ may be set based on various factors such as (1) the desired loop characteristics (e.g., a wide loop bandwidth for acquisition and a narrow loop bandwidth for tracking), (2) the characteristics of the reference signal (e.g., whether it is clean or noisy), (3) the characteristics of the oscillator signal, and so on. For a PLL with a ring oscillator, much of the jitter is typically due to noise from the ring oscillator. A wide loop bandwidth can normally reduce jitter due to oscillator noise. However, if the loop bandwidth is too wide, then jitter due to the reference signal may start to dominate.

In an embodiment, gain calculation/bandwidth control unit 630 implements an adaptive closed loop bandwidth mechanism to reduce jitter. When the digital PLL is locked, PFD 310 should not produce too many consecutive INC or DEC values. Jitter can be estimated by counting the number of consecutive INC and DEC values. The loop bandwidth and/or damping are adjusted (by changing the $K_I$ and/or $K_R$ gain values) such that jitter is reduced.

Figure 8:
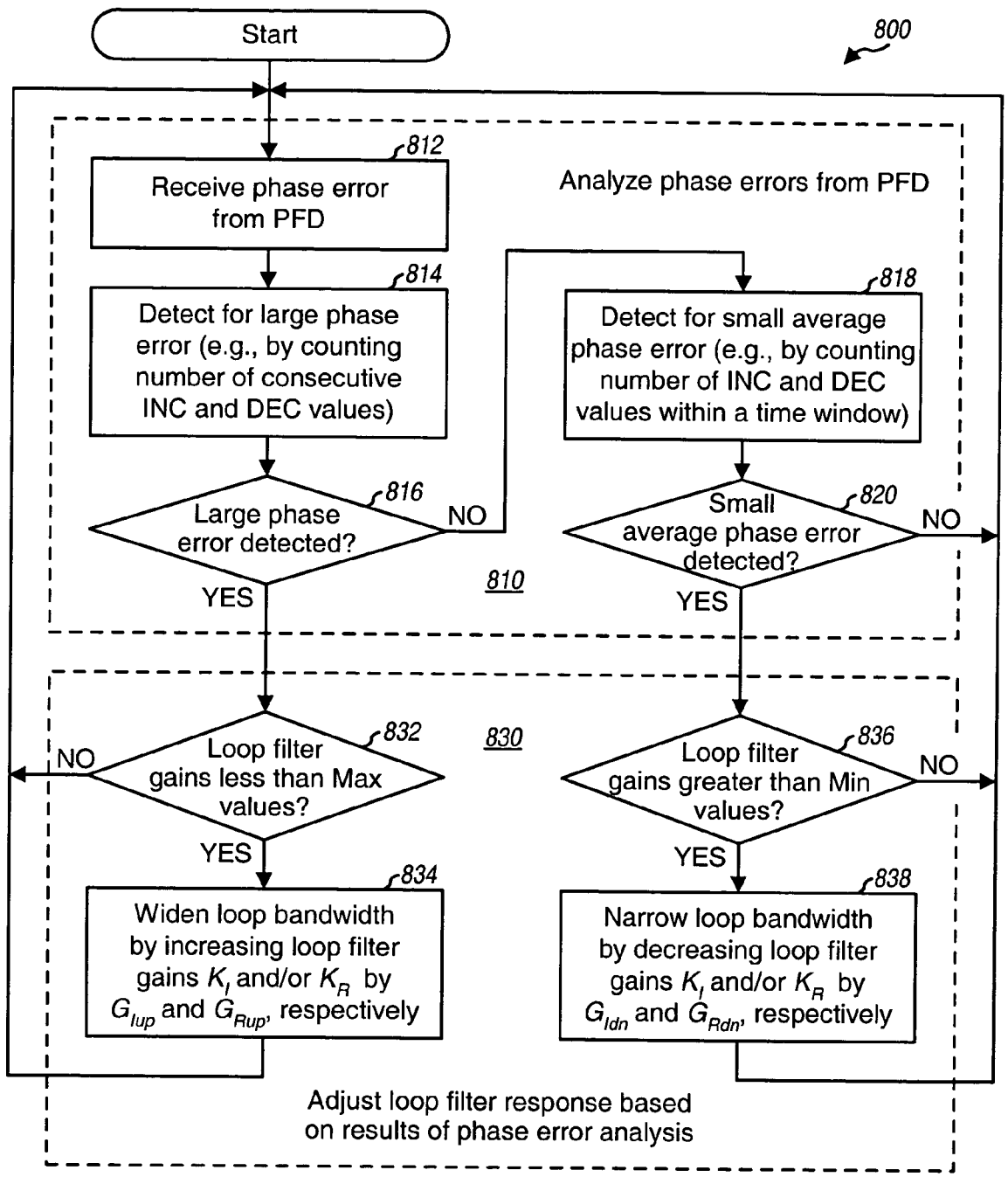
FIG. 8 shows a flow diagram of a process for adjusting the closed loop characteristics of the digital PLL to reduce jitter.

FIG. 8 shows a flow diagram of a process 800 for adjusting the closed loop characteristics of the digital PLL to reduce jitter. Process 800 may be implemented by gain calculation/bandwidth control unit 630 in FIGS. 6 and 7. Process 800 includes a block 810 that analyzes the phase errors from PFD 310 and a block 830 that adjusts the loop bandwidth and/or damping based on the results of the phase error analysis.

A phase error is received from PFD 310 and the value of the phase error is determined as either an INC value or a DEC value (step 812). A large phase error between the reference and feedback signals is then detected (step 814). In one embodiment, a large phase error is detected by counting the number of consecutive INC and DEC values. For this embodiment, a counter $N_{cons}$ is reset to zero whenever a change in phase error polarity is detected and incremented by one otherwise. A determination is then made whether or not a large phase error is detected (step 816). For the above embodiment, a large phase error may be declared if the counter $N_{cons}$ is equal to a designated value of $N_{max}$. The value $N_{max}$ may be determined based on computer analysis or empirical measurement of the digital PLL closed loop performance. As an example, $N_{max}$ may be set to four.

If a large phase error is detected in step 816 (e.g., if $N_{cons}=N_{max}$), then the loop bandwidth may be widened and/or the damping may be adjusted to allow the digital PLL to more quickly track out the large phase error that causes $N_{max}$ consecutive INC or DEC values to be generated. A determination is first made whether the loop filter gains ($K_I$ and/or $K_R$) are less than the maximum values ($K_{Imax}$ and $K_{Rmax}$) allowed for these gains (step 832). If the answer is 'no', then no adjustments are made to the loop filter gains and the process returns to step 812. Otherwise, the loop bandwidth may be widened and/or the damping may be adjusted by increasing the accumulator path gain $K_I$ by a factor of $G_{Iup}$ and/or increasing the forward path gain $K_R$ by a factor of $G_{Rup}$ (step 834). To simplify the loop filter design, $G_{Iup}$ and $G_{Rup}$ may each be a power of two (e.g., 2, 4, and so on). The factors $G_{Iup}$ and $G_{Rup}$ may be static values. Alternatively, the factors $G_{Iup}$ and $G_{Rup}$ may be dependent on the $K_I$ and $K_R$ gain values, the LF output, and so on. Since the current-to-frequency transfer function of ICO 240 is typically not linear across the entire frequency range of the ICO, the $K_I$ and $K_R$ gain values that provide good loop performance for different values of LF output may be determined and stored in a look-up table. The particular $K_I$ and $K_R$ gain values to use are then dependent on the current LF output value. In any case, after the gains $K_I$ and/or $K_R$ have been increased, the process returns to step 812. Back in step 814, the counter $N_{cons}$ may be reset to zero whenever it reaches $N_{max}$ so that the number of consecutive INC and DEC values can be counted anew after the loop filter gain adjustment in step 834.

Back in step 816, if a large phase error is not detected (e.g., $N_{cons} \neq N_{max}$), then a small average phase error is detected (step 818). In an embodiment, this is achieved by counting the number of INC and DEC values within a designated time window. This designated time window spans N,i, phase comparison periods (e.g., $N_{win}=10$) and can be a sliding window that includes the current phase error value plus $N_{win}-1$ immediately preceding phase error values. A small average phase error is detected if the number of INC values is equal to the number of DEC values.

If a small average phase error is not detected in step 820, then the process returns to step 812. Otherwise, the loop bandwidth may be narrowed toward the nominal loop bandwidth, which can result in less jitter (step 836). A determination is first made whether the loop filter gains ($K_I$ and/or $K_R$) are greater than the minimum values ($K_{Imin}$ and $K_{Rmin}$) allowed for these gains (step 836). If the answer is 'no', then no adjustments are made to the loop filter gains and the process returns to step 812. Otherwise, the loop bandwidth may be narrowed by decreasing the accumulator path gain $K_I$ by a factor of $G_{Idn}$ and/or decreasing the forward path gain $K_R$ by a factor of $G_{Rdn}$. $G_{Idn}$ and $G_{Rdn}$ may be the same as or different from $G_{Iup}$ and $G_{Rup}$ respectively. For example, $G_{Iup}$ and $G_{Rup}$ may be set to larger values so that the loop bandwidth is widened quickly when a large phase error is detected. $G_{Idn}$ and $G_{Rdn}$ may be set to smaller values so that the loop bandwidth slowly decays back to the nominal loop bandwidth after being widened due to the large phase error. After the loop filter gains have been decreased, the process returns to step 812.

A mechanism may be maintained in steps 814 and/or 818 to prevent excessive adjustments of the gains $K_I$ and/or $K_R$. For example, after each adjustment of the gains $K_I$ and/or $K_R$, another gain adjustment may be prevented for some number of phase comparison periods.

Figure 9:
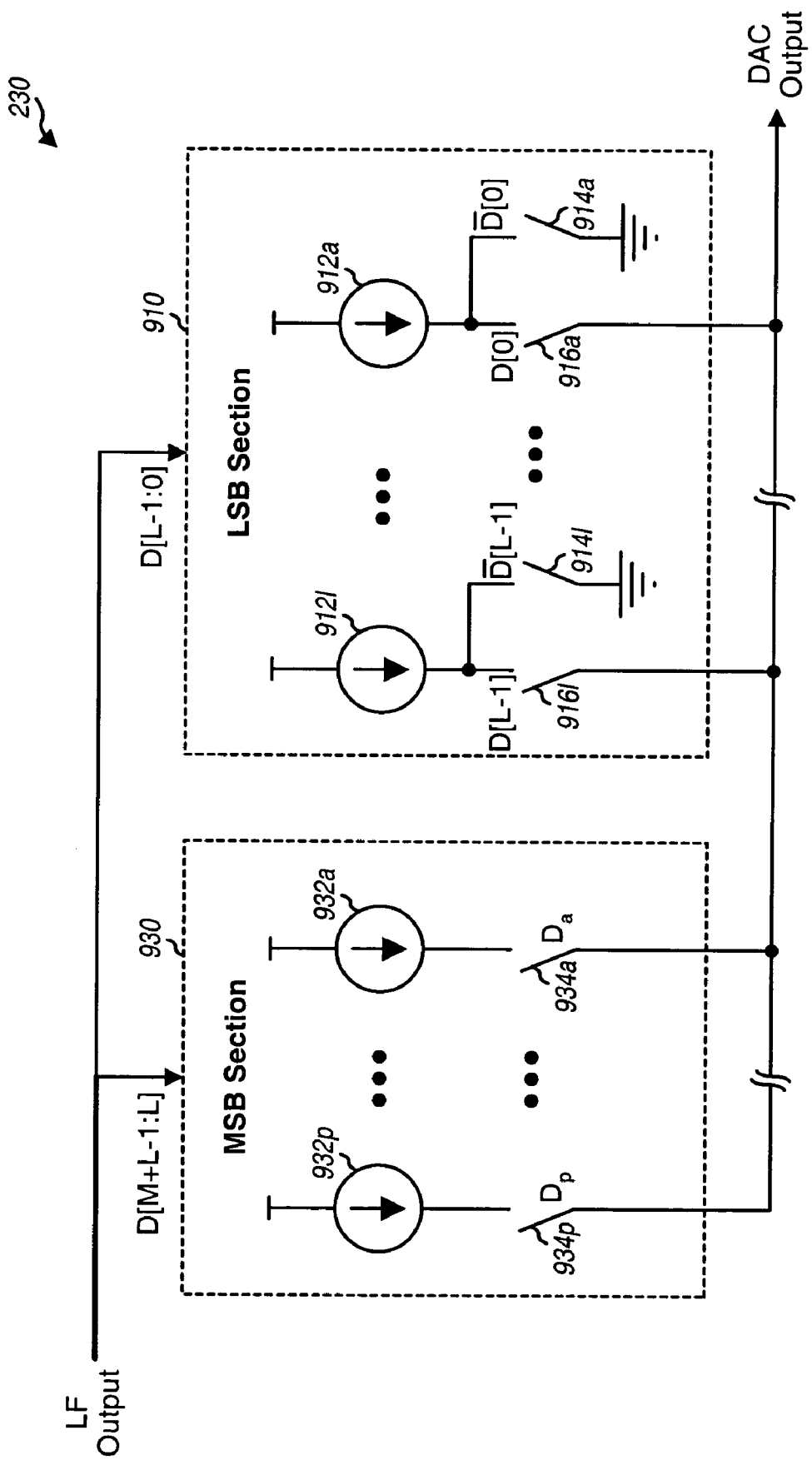
FIG. 9 shows an iDAC within the digital PLL.

FIG. 9 shows an embodiment of iDAC 230, which receives the LF output from loop filter 220 and provides the iDAC output for ICO 240. In this embodiment, iDAC 230 is partitioned into two sections 910 and 930. Section 910 implements the L least significant bits (LSBs) of the iDAC, and section 930 implements the M most significant bits (MSBs) of the iDAC, where L+M is the number of bits for the LF output and the iDAC. The LF output, denoted as D[L+M−1:0], is partitioned into an L-bit control D[L−1:0] for section 910 and an M-bit control D[L+M−1:L] for section 930.

When the digital PLL is locked, only a few LSBs of the LF output are likely to toggle to track small jitter variations over time, and the remaining MSBs of the LF output are likely to be fixed. To reduce power consumption, the L LSBs of the iDAC are implemented with steered current sources and the M MSBs of the iDAC are implemented with single-ended current sources. A steered current source provides its current to the iDAC output when switched on and to circuit ground when switched off. A steered current source can provide low switching ripple (and hence less jitter) since it always provides its current to either the iDAC output or circuit ground. A single-ended current source provides its current to the iDAC output when switched on and consumes no current when switched off. The use of steered current sources for the L LSBs can provide improve jitter performance while consuming small amounts of current since these are the L LSBs of the LF output. The use of single-ended current sources for the M MSBs can reduce power consumption while limiting ripples since the MSBs are less likely to toggle.

To improve iDAC linearity, the M MSBs are implemented with "thermal" decoding instead of binary decoding. For binary decoding of M bits, M current sources are used, with the first current source providing a current of I, the second current source providing a current of 2I, and so on, and the last current source providing a current of $2^{M-1}$·I. It is difficult to accurately match a large current source (e.g., one providing a current of $2^{M-1}$·I) to a small current source (e.g., one providing a current of I), especially as M becomes larger. Any error in the current scaling would then correspond to non-linearity in the iDAC output.

For thermal decoding of M bits, $2^M-1$ current sources are used, with each current source providing a current of I. These current sources can be matched more easily because they are all designed to provide the same amount of current. Consequently, smaller matching error is encountered and greater iDAC linearity is achieved. As many of the $2^M-1$ current sources are switched on as necessary based on the value of the M MSBs. The current sources to be switched on may be dispersed (e.g., randomly selected) among $2^M-1$ current sources to reduce any gradient linearity error, which is a systematic error across an IC die caused by manufacturing.

Thermal decoding is implemented for the M MSBs, which is more critical for iDAC linearity because each step of the M MSBs is a relatively large step. Thermal decoding may or may not be implemented for the L LSBs, which is less critical because each step of the L LSBs is a relatively small step.

The iDAC output may toggle between a major carry (e.g., between 31 and 32 if L=5). In this case, only one steered current source in the MSB section will toggle if the M MSBs are implemented with thermal decoding. Alternatively, a circuit can detect for conditions in which the L LSBs are near the major carry and turn on an auxiliary current source to avoid the toggling of the MSB current source. For example, if L=5 and the L LSBs are detected to be within a range of 25 to 31, then a value of 16 can be subtracted from the digital value received by the iDAC, and an auxiliary steered current source with a weight of 16 can be turned on. On the lower end, if the L LSBs are detected to be within a range of 0 to 6, then a value of 16 can be added to the digital value received by the iDAC, and an auxiliary N-MOS current source with a weight of 16 can be turned on to effectively subtract current from the iDAC output. Other ranges may also be used instead of the exemplary ranges given above. Turning on an auxiliary current source has the effect of centering the value of the L LSBs to avoid the MSB toggling.

For the embodiment shown in FIG. 9, LSB section 910 implements binary decoding and MSB section implements thermal decoding. Section 910 includes L current sources 912a through 912l. Current source 912a provides a current of I, current source 912b (not shown in FIG. 9) provides a current of 2·I, and so on, and current source 912l provides a current of $2^{L-1}$·I. Each current source 912 has one end coupled to the power supply and the other end coupled to one end of switches 914 and 916. The other end of switch 914 couples to circuit ground, and the other end of switch 916 couples to the iDAC output. A steered current source is made up of current source 912 and its switches 914 and 916. Switches 914 and 916 are controlled by D[i] and $\overline{D}$[i] signals, respectively, where i denotes the i-th current source in section 910. Only one switch (i.e., either switch 914 or 916) is turned on at any given moment. The current in current sources 912 is steered to circuit ground if switch 914 is turned on and steered to the iDAC output if switch 916 is turned on. Each of the L pairs of switches 914 and 916 in section 910 is controlled by a respective bit of the L-bit control D[L−1:0] for section 910.

Section 930 includes P current sources 932a through 932p, where P=$2^M$−1. Each current source 932 is designed to provide a current of $2^L$·I. Each current source 932 has one end coupled to the power supply and the other end coupled to one end of an associated switch 934. The other end of switch 934 couples to the iDAC output. The M-bit control D[L+M−1:L] for section 930 is decoded to obtain the $D_j$ and $\overline{D}_j$ signals for each of the current sources in section 930, where j denotes the j-th current source in section 930. Local decoding is performed for each cell, which is made up of a current source and its associated switches.

Current sources 912a through 912l in section 910 and current sources 932a through 932p in section 930 may be implemented with cascode P-channel metal oxide semiconductor (P-MOS) current sources. Cascade P-MOS current sources can enhance iDAC linearity and provide good immunity to low frequency supply noise.

Figure 10:
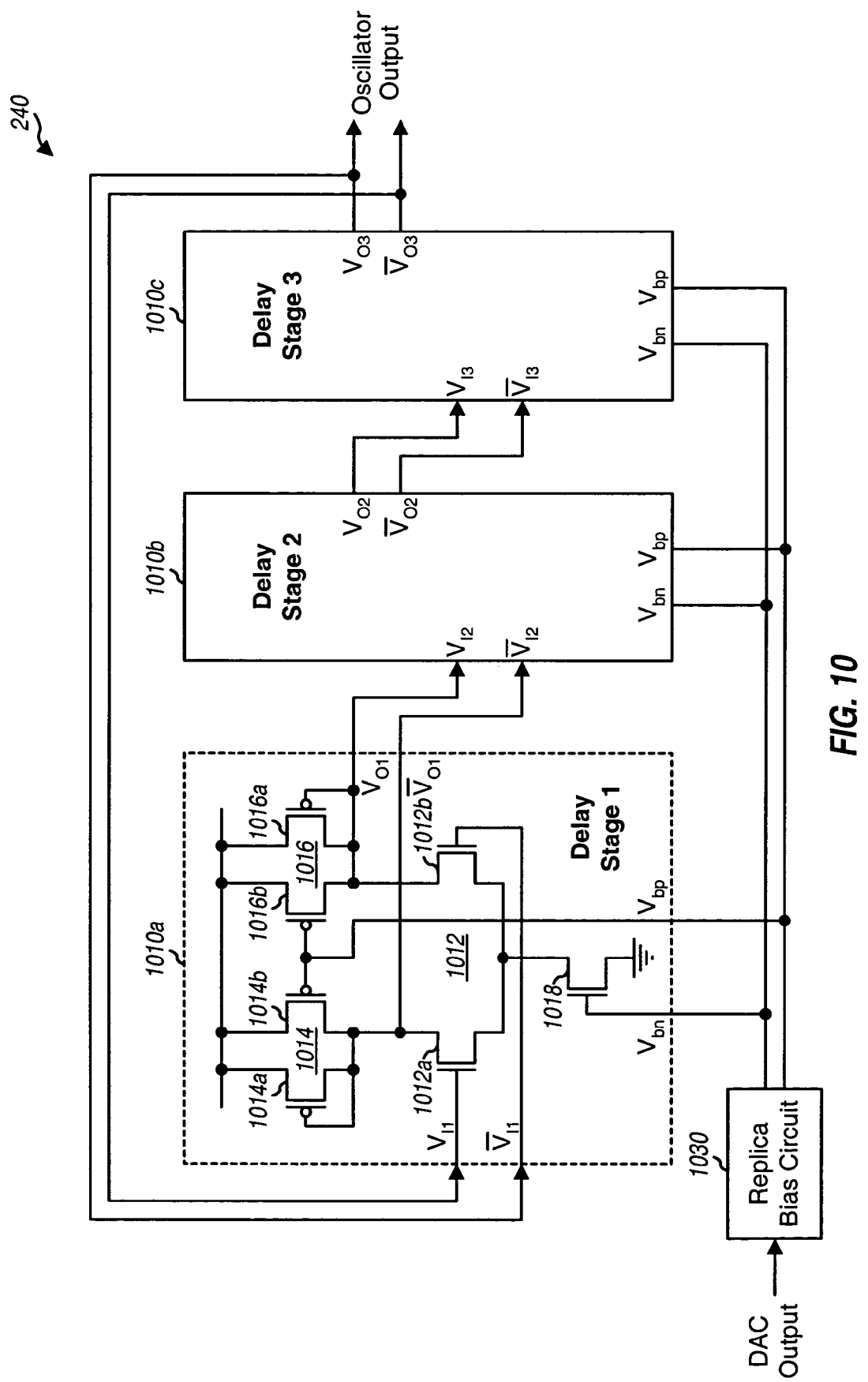
FIG. 10 shows an ICO within the digital PLL.

FIG. 10 shows an embodiment of ICO 240, which is a 3-stage ring oscillator. ICO 240 includes three delay stages 1010a, 1010b, and 1010c. Each delay stage 1010 includes an input differential pair 1012, a bias current source 1018, and circuit loads 1014 and 1016.

For each delay stage 1010, input differential pair 1012 comprises N-channel field effect transistors (N-FETs) 1012a and 1012b having (1) sources that couple together and to bias current source 1018, (2) gates that form the differential input, $V_I$ and $\overline{V}_I$, for the delay stage, and (3) drains that couple to circuit loads 1014 and 1016, respectively. The drains of N-FETs 1012a and 1012b further provide the differential output, $\overline{V}_O$ and $V_O$, for the delay stage. Circuit load 1014 comprises P-channel field effect transistors (P-FETs) 1014a and 1014b having (1) sources that couple together and to the drain of N-FET 1012a and (2) drains that couple to the power supply. Similarly, circuit load 1016 comprises P-FETs 1016a and 1016b having (1) sources that couple together and to the drain of N-FET 1012b and (2) drains that couple to the power supply. The gates of P-FETs 1014a and 1016a couple to the sources of P-FETs 1014a and 1016a, respectively. The gates of P-FETs 1014b and 1016b couple together and receive a $V_{bp}$ control signal. Bias current source 1018 comprises an N-FET having a gate that receives a $V_{bn}$ control signal, a source that couples to circuit ground, and a drain that couples to the sources of N-FETs 1012a and 1012b. Delay stage 1010 is also described by Maneatis, J. G., in a paper entitled "Low-Jitter Process-Independent DLL and PLL Based on Self-Biased Techniques," IEEE Journal of Solid-State Circuits, Vol. 31, No. 11, November 1996.

The three delay stages 1010a, 1010b, and 1010c are coupled in a ring configuration with the differential output of each delay stage being coupled to the differential input of a subsequent delay stage, as shown in FIG. 10. A replica bias circuit 1030 receives the iDAC output and provides the $V_{bp}$ and $V_{bn}$ control signals for all three delay stages. No additional filtering is required between iDAC 230 and ICO 240. The ICO configuration shown in FIG. 10 can provide good immunity to noise on the power supply and a high linearity range.

Referring back to FIG. 2, divider 250 may be implemented with a counter, registers, and so on. Divider 250 may also implement a swallow counter if N is not an integer, as is known in the art.

Figure 11:
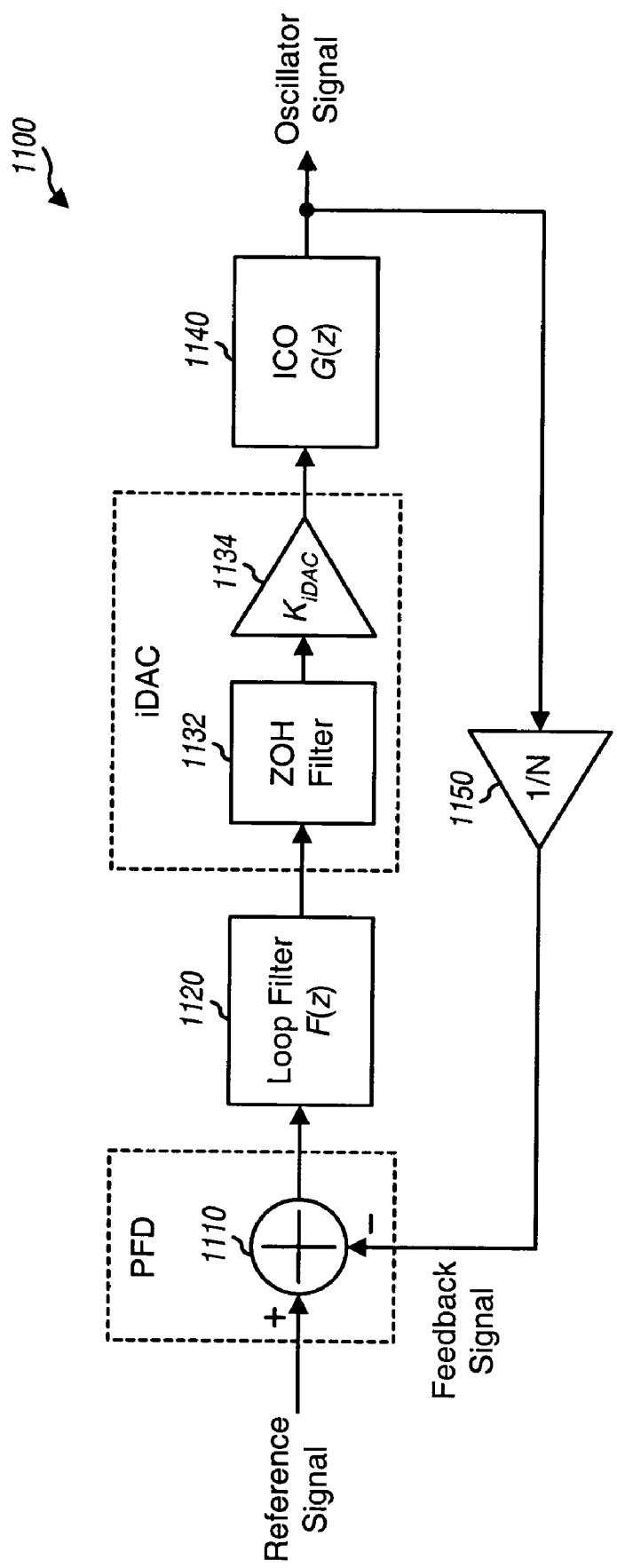
FIG. 11 shows a simplified model of the digital PLL.

FIG. 11 shows a model 1100 of digital PLL 200. When locked, digital PLL 200 behaves as a linear discrete-time system. For model 1100, PFD 210 is modeled by a summer 1110, loop filter 220 is modeled by a unit 1120 with a transfer function of F(z), iDAC 230 is modeled by a zero-order hold (ZOH) filter 1132 and a gain element 1134 with a gain of $K_{iDAC}$, ICO 240 is modeled by a unit 1140 with a transfer function of G(z), and divider 250 is modeled by a gain element 1150 with a gain of 1/N. $K_{iDAC}$ represents the gain of iDAC 230 and N is the frequency divide ratio.

The loop filter transfer function F(z) may be expressed as:

$$F(z) = K_R + \frac{K_I}{1 - z^{-1}}. \quad \text{Eq (2)}$$

The ICO transfer function G(z) may be expressed as:

$$G(z) = K_{ICO} \cdot \frac{1}{1 - z^{-1}}, \quad \text{Eq (3)}$$

where $K_{ICO}$ represents the gain of ICO 240 (i.e., the slope of the current-to-frequency transfer function). The closed-loop transfer function H(z) for digital PLL 200 may be expressed as:

$$H(z) = \frac{K \cdot (K_R + K_I) \cdot \left[z - \frac{K_R}{K_R + K_I}\right]}{z^2 - \left(2 - \frac{K \cdot (K_R + K_I)}{N}\right) \cdot z + \left(1 - \frac{K \cdot K_R}{N}\right)}, \quad \text{Eq (4)}$$

where $K = K_{iDAC} \cdot K_{ICO}$.

The closed loop transfer function H(z) may be plotted for various values of loop filter gains $K_I$ and $K_R$. It can be shown that the forward path gain $K_R$ has small impact on the loop bandwidth but may be used to control the damping factor of the closed loop response, and thus the locking characteristics of the digital PLL. The accumulator path gain $K_I$ affects both the loop bandwidth and damping factor. The loop bandwidth is a strong function of the accumulator path gain $K_I$ and increases with larger $K_I$ gain values.

Digital PLL 200 is low-area, low-power, and low-jitter. Low area is achieved by eliminating a large analog-based loop filter, which can occupy as much as 50% of the total area of an analog PLL implemented on an integrated circuit. Low power is achieved by eliminating extra overhead usually associated with analog PLLs, such as current for charge pumps, current generators, voltage-to-current converters, and so on. Low jitter is achieved with the adaptive PFD and adaptive loop filter described above.

Figure 12:
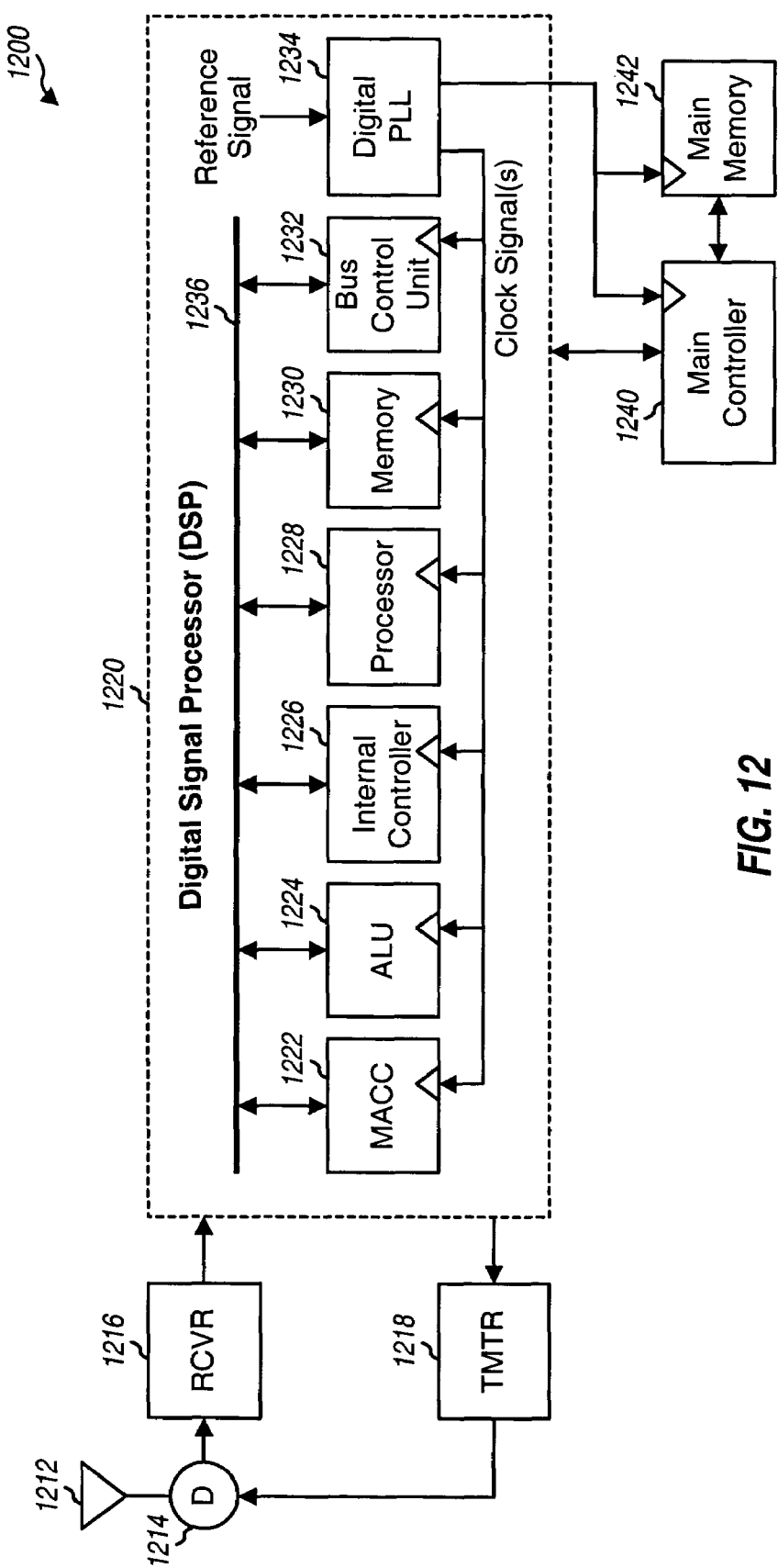
FIG. 12 shows a wireless device with the digital PLL.

FIG. 12 shows a block diagram of a wireless device 1200 in a wireless communication system. Wireless device 1200 may be a cellular phone, a terminal, a handset, or some other devices or designs. The wireless communication system may be a Code Division Multiple Access (CDMA) system, a Global System for Mobile Communications (GSM) system, a multiple-input multiple-output (MIMO) system, an orthogonal frequency division multiplexing (OFDM) system, an orthogonal frequency division multiple access (OFDMA) system, and so on. Wireless device 1200 is capable of providing bi-directional communication via a receive path and a transmit path.

For the receive path, signals transmitted by base stations are received by an antenna 1212, routed through a duplexer (D) 1214, and provided to a receiver unit (RCVR) 1216. Receiver unit 1216 conditions (e.g., filters, amplifies, and frequency downconverts) the received signal and digitizes the conditioned signal to provide data samples, which are provided to a digital signal processor (DSP) 1220 for further processing. For the transmit path, data to be transmitted from wireless device 1200 is provided by DSP 1220 to a transmitter unit (TMTR) 1218. Transmitter unit 1218 conditions (e.g., filters, amplifies, and frequency upconverts) the data and generates a modulated signal, which is routed through duplexer 1214 and transmitted via antenna 1212 to the base stations.

DSP 1220 includes various processing units such as, for example, a multiply-accumulate (MACC) unit 1222, an arithmetic logic unit (ALU) 1224, an internal controller 1226, a processor 1228, a memory unit 1230, and a bus control unit 1232, all of which are coupled via a bus 1236. DSP 1220 further includes a digital PLL 1234 that may be implemented with digital PLL 200. Digital PLL 1234 receives a reference signal (e.g., from a temperature compensated crystal oscillator (TCXO)) and generates clock signals for the processing units within DSP 1220 and possibly processing units external to DSP 1220 (e.g., a main controller 1240 and a main memory unit 1242). DSP 1220 may perform encoding, interleaving, modulation, channelization (e.g., with Walsh codes), spectral spreading, and so on, for the transmit path. DSP 1220 may perform despreading, channelization, democlulating, deinterleaving, decoding, and so on, for the receive path. The processing by DSP 1220 is determined by the communication system.

FIG. 12 shows an exemplary design of a wireless device in which the digital PLL described herein may be implemented. The digital PLL described herein may also be implemented in other electronic devices.

The digital PLL described herein may be implemented in an application specific integrated circuit (ASIC), a digital signal processor (DSP), a digital signal processing device (DSPD), a programmable logic device (PLD), a field programmable gate array (FPGA), a processor, a controller, a micro-controller, a microprocessor, and other electronic units. The digital PLL may be implemented within the one or multiple integrated circuit (IC) dies and in the one or multiple ICs. For example, all units of the digital PLL may be implemented on one IC die. As another example, the PFD, loop filter, and divider may be implemented on one IC die, and the iDAC and ICO may be implemented on another IC die.

The digital PLL described herein may also be fabricated with various IC process technologies such as CMOS, NMOS, BJT, and so on. CMOS technology can fabricate both N-FET and P-FET devices on the same die, whereas NMOS technology can only fabricate N-FET devices. The digital PLL described herein may also be fabricated using different device size technologies (e.g., 0.13 mm, 30 nm, and so on).

Portions of the digital PLL (e.g., process 500 in FIG. 5, process 800 in FIG. 8, control of the digital PLL operation, and so on) may be implemented in software. For a software implementation, the processes and control may be implemented with modules (e.g., procedures, functions, and so on) that perform the functions described herein. The software codes may be stored in a memory unit (e.g., memory unit 1230 or 1242 in FIG. 12) and executed by a processor (e.g., processor 1228 or controller 1240). The memory unit may be implemented within the processor or external to the processor, in which case it can be communicatively coupled to the processor via various means as is known in the art.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a phase-frequency detector (PFD) operative to receive a reference signal and a feedback signal, compare phases of the reference and feedback signals to determine a phase error between the reference and feedback signals, and provide a PFD output comprised of PFD values, wherein each PFD value is a multi-bit value determined by the phase error and a detector gain; and
   a loop filter (LF) operative to receive and filter the PFD output and provide an LF output, wherein the LF output is updated for each PFD value received on the PFD output.

2. The integrated circuit of claim 1, further comprising:
   an oscillator operative to receive the LF output and provide an oscillator signal having a phase determined by the LF output; and
   a divider operative to receive the oscillator signal, divide the oscillator signal in frequency by a factor of N, where N is one or greater, and provide the feedback signal.

3. The integrated circuit of claim 1, wherein the detector gain is adjusted in an acquisition mode and maintained in a tracking mode.

4. The integrated circuit of claim 1, wherein the detector gain is initialized to a maximum value and thereafter decreased whenever a change in phase error polarity is detected.

5. The integrated circuit of claim 1, wherein the PFD is further operative to provide a clock signal having a pulse for each PFD value in the PFD output, and wherein the loop filter is operative to update the LF output with the clock signal.

6. The integrated circuit of claim 5, wherein the pulse in the clock signal for each PFD value is delayed by a particular amount of time relative to a start of the PFD value.

7. The integrated circuit of claim 1, wherein the phase error is a first value if the phase of the reference signal is early with respect to the phase of the feedback signal and is a second value if the phase of the reference signal is late with respect to the phase of the feedback signal.

8. The integrated circuit of claim 7, wherein the phase error is a third value if the phase-frequency detector is unable to discern whether the reference signal is early or late with respect to the feedback signal.

9. The integrated circuit of claim 1, wherein the detector gain is a power of two.

10. The integrated circuit of claim 1, wherein the detector gain is a small value during tracking and is a larger value during acquisition.

11. A device comprising:
    a phase-frequency detector (PFD) operative to receive a reference signal and a feedback signal, compare phases of the reference and feedback signals to determine a phase error between the reference and feedback signals, and provide a PFD output comprised of PFD values, wherein each PFD value is a multi-bit value determined by the phase error and a detector gain; and
    a loop filter (LF) operative to receive and filter the PFD output and provide an LF output, wherein the LF output is updated for each PFD value received on the PFD output.

12. The device of claim 11, wherein the detector gain is adjusted in an acquisition mode and maintained in a tracking mode.

13. The device of claim 11, wherein the detector gain is a small value during tracking and is a larger value during acquisition.

14. An apparatus comprising:
    means for comparing phases of a reference signal and a feedback signal to determine a phase error between the reference and feedback signals;
    means for providing a phase-frequency detector (PFD) output comprised of PFD values, wherein each PFD value is a multi-bit value determined by the phase error and a detector gain;
    means for filtering the PFD output to obtain a loop filter (LF) output;
    means for providing an oscillator signal having a phase determined by the LF output; and
    means for dividing the oscillator signal in frequency by a factor of N to obtain the feedback signal, where N is one or greater.

15. The apparatus of claim 14, wherein the detector gain is adjusted in an acquisition mode and maintained in a tracking mode.

16. The apparatus of claim 14, wherein the detector gain is a small value during tracking and is a larger value during acquisition.

17. An integrated circuit comprising:
a phase-frequency detector (PFD) operative to receive a reference signal and a feedback signal, compare phase of the reference signal against phase of the feedback signal, and provide a detector output comprised of a sequence of phase error values, each phase error value indicating whether the phase of the reference signal is early or late with respect to the phase of the feedback signal; and
a loop filter (LF) operative to receive and filter the detector output and provide an LF output, wherein the loop filter is operative to adjust loop bandwidth of a digital phase-locked loop (PLL) based on the sequence of phase error values from the phase-frequency detector.

18. The integrated circuit of claim 17, further comprising:
an oscillator operative to receive the LF output and provide an oscillator signal having a phase determined by the LF output; and
a divider operative to receive the oscillator signal, divide the oscillator signal in frequency by a factor of N, where N is one or greater, and provide the feedback signal.

19. The integrated circuit of claim 17, wherein the loop filter is operative to increase the loop bandwidth if a large phase error between the reference and feedback signals is detected.

20. The integrated circuit of claim 19, wherein the large phase error is detected if a particular number of consecutive phase error values with same polarity are received in the detector output.

21. The integrated circuit of claim 17, wherein the loop filter is operative to decrease the loop bandwidth if a small average phase error is detected.

22. An integrated circuit comprising:
a phase-frequency detector (PFD) operative to receive a reference signal and a feedback signal, compare phase of the reference signal against phase of the feedback signal, and provide a detector output comprised of a sequence of phase error values, each phase error value indicating whether the phase of the reference signal is early or late with respect to the phase of the feedback signal; and
a loop filter (LF) operative to receive and filter the detector output and provide an LF output, wherein the loop filter is operative to adjust loop bandwidth of a digital phase-locked loop (PLL) based on the sequence of phase error values and to decrease the loop bandwidth if a small average phase error is detected, and wherein the small average phase error is detected if, for a designated time window, the number of phase error values with a first polarity, indicating the phase of the reference signal being early, is equal to the number of phase error values with a second polarity, indicating the phase of the feedback signal being early.

23. A device comprising:
a phase-frequency detector (PFD) operative to receive a reference signal and a feedback signal, compare phase of the reference signal against phase of the feedback signal, and provide a detector output comprised of a sequence of phase error values, each phase error value indicating whether the phase of the reference signal is early or late with respect to the phase of the feedback signal; and
a loop filter (LF) operative to receive and filter the detector output and provide an LF output wherein the loop filter is operative to adjust loop bandwidth of a digital phase-locked loop (PLL) based on the sequence of phase error values from the phase-frequency detector.

24. An apparatus comprising:
means for comparing phases of a reference signal and a feedback signal to determine a phase error between the reference and feedback signals;
means for providing a detector output comprised of phase error values, each phase error value indicating whether the phase of the reference signal is early or late with respect to the phase of the feedback signal;
means for filtering the detector output to obtain a loop filter (LF) output; and
means for adjusting loop bandwidth of a digital phase-locked loop (PLL) based on the sequence of phase error values from the means for comparing phases.

25. An integrated circuit comprising:
a loop filter (LF) operative to receive and filter an LF input with first and second gains and provide an LF output; and
a control unit operative to receive a detector output from a phase-frequency detector (PFD) indicating whether phase of a reference signal is early or late with respect to phase of a feedback signal, perform phase error analysis on the detector output, and adjust the first and second gains based on results of the phase error analysis, wherein the first and second gains determine loop bandwidth and damping of a digital phase locked loop (PLL) that includes the loop filter and the phase-frequency detector.

26. The integrated circuit of claim 25, wherein the detector output comprises a sequence of phase error values, each phase error value indicating whether the phase of the reference signal is early or late with respect to the phase of the feedback signal.

27. The integrated circuit of claim 26, wherein the control unit is operative to increase the first gain, the second gain, or both the first and second gains, if a large phase error is detected.

28. The integrated circuit of claim 27, wherein the control unit is operative to detect for the large phase error by counting number of consecutive phase error values with same polarity and comparing the number of consecutive same polarity phase error values against a predetermined count value.

29. The integrated circuit of claim 26, wherein the control unit is operative decrease the first gain, the second gain, or both the first and second gains if a small average phase error is detected.

30. The integrated circuit of claim 29, wherein the control unit is operative to detect for the small average phase error by counting the number of phase error values with a first polarity and the number of phase error values with a second polarity within a designated time window, and wherein the small average phase error is declared if the number of phase error values with the first polarity is equal to the number of phase error values with the second polarity.

31. The integrated circuit of claim 25, wherein the first and second gains are powers of two.

32. The integrated circuit of claim 25, wherein the control unit is operative to scale the first and second gains upward by first and second scaling factors, respectively, and to scale the first and second cams downward by third and fourth scaling factors, respectively.

33. The integrated circuit of claim 32, wherein the first and second scaling factors are larger than the third and fourth scaling factors, respectively.

34. An apparatus comprising:
- means for receiving a detector output from a phase-frequency detector (PFD) indicating whether phase of a reference signal is early or late with respect to phase of a feedback signal;
- means for detecting for a large phase error in the detector output;
- means for detecting for a small average phase error in the detector output;
- means for increasing loop bandwidth of a phase locked loop (PLL) if the large phase error is detected; and
- means for decreasing the loop bandwidth if the small average phase error is detected.

35. A method of adjusting loop bandwidth of a digital phase-locked loop (PLL), comprising:
- receiving a detector output from a phase-frequency detector (PFD) indicating whether phase of a reference signal is early or late with respect to phase of a feedback signal;
- detecting for a large phase error in the detector output;
- detecting for a small average phase error in the detector output;
- increasing the loop bandwidth if the large phase error is detected; and
- decreasing the loop bandwidth if the small average phase error is detected.

* * * * *